(12) United States Patent
Bowlerwell et al.

(10) Patent No.: US 12,273,083 B2
(45) Date of Patent: Apr. 8, 2025

(54) CIRCUITRY FOR PROVIDING AN OUTPUT VOLTAGE

(71) Applicant: Cirrus Logic International Semiconductor Ltd., Edinburgh (GB)

(72) Inventors: John B. Bowlerwell, Dunfermline (GB); Andrew J. Howlett, Edinburgh (GB); Saurabh Singh, Edinburgh (GB); Andrew Buist, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 828 days.

(21) Appl. No.: 17/233,811

(22) Filed: Apr. 19, 2021

(65) Prior Publication Data

US 2021/0351753 A1 Nov. 11, 2021

Related U.S. Application Data

(60) Provisional application No. 63/021,805, filed on May 8, 2020.

(30) Foreign Application Priority Data

May 20, 2020 (GB) ...................................... 2007513

(51) Int. Cl.
*H03F 1/14* (2006.01)
*G06F 1/18* (2006.01)
(Continued)

(52) U.S. Cl.
CPC ........... *H03G 1/0029* (2013.01); *G06F 1/189* (2013.01); *H02M 3/156* (2013.01); *H03F 1/52* (2013.01)

(58) Field of Classification Search
CPC ....... H03G 1/0029; G06F 1/189; G06F 1/266; G06F 1/26; H02M 3/156; G05F 1/573; H03F 1/523; H03F 2200/45
(Continued)

(56) References Cited

U.S. PATENT DOCUMENTS 6,348,833 B1 * 2/2002 Tsujimoto ............... G05F 1/575
327/143
6,608,520 B1 * 8/2003 Miyazaki ............... G05F 1/575
327/540
(Continued)

FOREIGN PATENT DOCUMENTS

EP 3012706 A1 4/2016

OTHER PUBLICATIONS

Combined Search and Examination Report under Sections 17 and 18(3), UKIPO, Application No. GB2007513.1, mailed Nov. 13, 2020.
(Continued)

*Primary Examiner* — Khanh V Nguyen
(74) *Attorney, Agent, or Firm* — Jackson Walker L.L.P.

(57) ABSTRACT

The present disclosure relates to circuitry for providing an output voltage. The circuitry comprises: voltage generator circuitry configured to provide an output voltage to an output node of the circuitry; current limiter circuitry operable to perform current limiting so as to limit a current supplied at the output node of the circuitry; detection circuitry configured to output a detection signal when a load voltage across a load coupled to the output node of the circuitry reaches a target voltage; and delay circuitry configured to receive the detection signal and to output a control signal to deactivate current limiting by the current limiter circuitry after a predetermined delay period after receiving the detection signal.

19 Claims, 11 Drawing Sheets

(51) Int. Cl.
*H02M 3/156* (2006.01)
*H03F 1/52* (2006.01)
*H03G 1/00* (2006.01)

(58) Field of Classification Search
USPC .............................................. 330/207 P, 298
See application file for complete search history.

(56) References Cited

U.S. PATENT DOCUMENTS

| | | | | |
|---|---|---|---|---|
| 6,624,994 | B1* | 9/2003 | Schmoock | H03K 17/0822 |
| | | | | 323/908 |
| 6,801,419 | B2* | 10/2004 | Fukui | G05F 1/573 |
| | | | | 361/93.1 |
| 6,922,321 | B2* | 7/2005 | Katoh | G05F 1/575 |
| | | | | 361/93.9 |
| 6,977,491 | B1* | 12/2005 | Caldwell | G05F 1/573 |
| | | | | 323/282 |
| 7,233,462 | B2* | 6/2007 | Kanakubo | G05F 1/5735 |
| | | | | 361/93.7 |
| 7,646,574 | B2* | 1/2010 | Imura | G05F 1/575 |
| | | | | 323/275 |
| 7,923,976 | B2* | 4/2011 | Al-Shyoukh | G05F 1/569 |
| | | | | 361/18 |
| 8,040,652 | B2* | 10/2011 | Forghani-zadeh | H03K 17/122 |
| | | | | 361/93.1 |
| 9,483,098 | B2* | 11/2016 | Bridges | G06F 1/305 |
| 2009/0201618 | A1* | 8/2009 | Hasegawa | G05F 1/573 |
| | | | | 361/93.9 |
| 2010/0079121 | A1* | 4/2010 | Yanagawa | G05F 1/573 |
| | | | | 323/277 |
| 2013/0176007 | A1* | 7/2013 | Devegowda | G05F 1/573 |
| | | | | 323/273 |
| 2017/0205840 | A1* | 7/2017 | Ogura | G05F 1/46 |
| 2018/0233904 | A1* | 8/2018 | Terrill | H02H 9/02 |
| 2020/0064875 | A1* | 2/2020 | Gonapati | G05F 1/573 |
| 2020/0081466 | A1* | 3/2020 | Ideno | G05F 1/569 |
| 2020/0272184 | A1* | 8/2020 | Petenyi | G05F 1/565 |
| 2021/0018944 | A1* | 1/2021 | Matyscak | G05F 1/565 |

OTHER PUBLICATIONS

Examination Report under Section 18(3), UKIPO, Application No. GB2007513.1, mailed Aug. 24, 2021.
Combined Search and Examination Report under Sections 17 and 18(3), UKIPO, Application No. GB2107923.1, mailed Jan. 31, 2022.

* cited by examiner

CIRCUITRY FOR PROVIDING AN OUTPUT VOLTAGE

The present disclosure claims priority to U.S. Provisional Patent Application Ser. No. 63/021,805, filed May 8, 2020, and United Kingdom Patent Application No. 2007513.1, filed May 20, 2020, each of which is incorporated by reference herein in its entirety.

FIELD OF THE INVENTION

The present disclosure relates to circuitry for providing an output voltage. The output voltage may be used, for example, as a bias voltage, reference voltage, power supply or the like.

BACKGROUND

Many electronic devices include voltage generator circuitry configured to generate an output voltage, based on some reference voltage, to be used in downstream circuitry of the device, e.g. as a bias voltage, reference voltage, power supply or the like in the downstream circuitry.

For example, many electronic devices such as mobile telephones, tablet and laptop computers, gaming devices and accessory devices such as headphones, earphones and the like include transducers such as microphones, force sensors and the like that require a bias voltage in order to operate correctly. The bias voltage is typically generated by voltage generator circuitry (which may be implemented in one or more integrated circuits) of the device, with the voltage generator circuitry providing one or more bias output nodes to which a transducer can be coupled so as to receive an appropriate bias voltage.

SUMMARY

According to a first aspect, the invention provides circuitry for providing an output voltage, the circuitry comprising:
  voltage generator circuitry configured to provide an output voltage to an output node of the circuitry;
  current limiter circuitry operable to perform current limiting so as to limit a current supplied at the output node of the circuitry;
  detection circuitry configured to output a detection signal when a load voltage across a load coupled to the output node of the circuitry reaches a target voltage; and
  delay circuitry configured to receive the detection signal and to output a control signal to deactivate current limiting by the current limiter circuitry after a predetermined delay period after receiving the detection signal.

The current limiter circuitry may comprise a controllable switch device.

The controllable switch device may comprise a MOSFET device, for example.

The detection circuitry may be configured to:
  compare the output voltage provided by the voltage generator circuitry to the load voltage across the load; and
  output the detection signal when the load voltage reaches the target voltage, wherein the target voltage is a predetermined value based on the output voltage provided by the voltage generator circuitry.

The delay circuitry may comprise digital delay circuitry.

Alternatively, the delay circuitry may comprise analogue delay circuitry.

The voltage generator circuitry may comprise amplifier circuitry.

The amplifier circuitry may be selectively operable in a first operating mode and a second operating mode.

The amplifier circuitry may be operative in the second operating mode when the current limiter circuitry is activated to limit the current supplied at the output node.

The circuitry may further comprise logic circuitry configured to detect activation of the current limiter circuitry and, in response to detecting activation of the current limiter circuitry, to output a control signal to the amplifier circuitry to cause the amplifier circuitry to operate in its second operating mode.

The logic circuitry may be further configured to detect deactivation of the current limiter circuitry, and, in response to detecting deactivation of the current limiter circuitry, to output a control signal to the amplifier circuitry to cause the amplifier circuitry to operate in its first operating mode.

The first operating mode may be a default or preconfigured operating mode of the amplifier circuitry.

The first operating mode may be a normal operating mode and the second operating mode may be a compensation mode to compensate for an absence of a load coupled to an output node of the amplifier circuitry.

The first operating mode may be a normal operating mode and the second operating mode may be an adjusted operating parameter operating mode.

In the adjusted operating parameter operating mode one or more operating parameters of the amplifier circuitry may be adjusted, in comparison with the first operating mode.

The one or more operating parameters may comprise:
  power consumption;
  noise;
  accuracy;
  stability; and
  output voltage.

The amplifier circuitry may be dynamically reconfigurable to operate in the first and second operating modes.

The circuitry may comprise a plurality of output nodes, each output node being associated with respective current limiter circuitry.

The amplifier may be operative in the second operating mode when the current limiter circuitry associated with any one of the plurality of output nodes is activated to limit the current supplied at the output node.

The circuitry may further comprise logic circuitry configured to detect activation of the current limiter circuitry associated with any one of the plurality of output nodes and, in response to detecting activation of the current limiter circuitry, to output a control signal to the amplifier circuitry to cause the amplifier circuitry to operate in its second operating mode.

The logic circuitry may be further configured to detect deactivation of the current limiter circuitry associated with the one of the plurality of output nodes, and, in response to detecting deactivation of the current limiter circuitry, to output a control signal to the amplifier circuitry to cause the amplifier circuitry to operate in its first operating mode.

The logic circuitry may be further configured not to output a control signal to the amplifier circuitry to cause the amplifier circuitry to operate in its second operating mode in response to detection of a subsequent activation of the current limiter circuitry associated with any one of the plurality of output nodes.

The current limiter circuitry may comprise current mirror circuitry comprising:
the controllable switch device;
a second controllable switch device; and
a reference current source for generating a reference current,
wherein the current mirror circuitry is configured to mirror the reference current through the controllable switch device.

The current limiter circuitry may further comprise:
a third controllable switch device;
a controllable second current source for generating a second reference current; and
buffer circuitry,
wherein the current limiter circuitry is configured such that an output of the buffer circuitry toggles when a current through the third controllable switch device reaches a predetermined level.

The circuitry may further comprise a mode control switch configured to selectively couple a control terminal of the controllable switch device to a control voltage so as to cause the controllable switch device to operate in a fully on mode.

A control terminal of the mode control switch may be coupled to an output of the buffer circuitry.

The control terminal of the mode control switch may be coupled to the output of the buffer circuitry via delay circuitry.

The circuitry may comprise bias generator circuitry, regulator circuitry or reference voltage generator circuitry, for example.

According to a second aspect, the invention provides circuitry for providing an output voltage, the circuitry comprising:
amplifier circuitry configured to generate and output a voltage to an output node, wherein the amplifier circuitry is configured for operation in either a first mode or a second mode; and
current limiter circuitry, wherein the current limiter circuitry is selectively operable to limit a current supplied at the output node,
wherein the circuitry is configured to switch the amplifier circuitry into its second mode when the current limiter circuitry is activated to limit the current supplied at the output node.

The circuitry may comprise a plurality of output nodes, each output node being associated with current limiter circuitry.

The circuitry may be configured to switch the amplifier circuitry into its second mode when the current limiter circuitry associated with any one of the plurality of output nodes is activated.

The circuitry may further comprise logic circuitry configured to detect activation of the currently limiter circuitry and, in response to detecting activation of the current limiter circuitry, to output a control signal to the amplifier circuitry to switch the amplifier circuitry into its second operating mode.

The logic circuitry may be further configured not to output a control signal to the amplifier circuitry to cause the amplifier circuitry to operate in its second operating mode in response to detection of a subsequent activation of the current limiter circuitry associated with any one of the plurality of output nodes.

The current limiter circuitry may comprise a controllable switch device.

The controllable switch device may comprises a MOSFET device, for example.

The circuitry may further comprise logic circuitry configured to detect activation of the current limiter circuitry and, in response to detecting activation of the current limiter circuitry, to output a control signal to the amplifier circuitry to cause the amplifier circuitry to operate in its second mode.

The logic circuitry may be further configured to detect deactivation of the current limiter circuitry, and, in response to detecting deactivation of the current limiter circuitry, to output a control signal to the amplifier circuitry to cause the amplifier circuitry to operate in its first mode.

The first mode may be a default or preconfigured operating mode of the amplifier circuitry.

The first mode may be a normal operating mode and the second mode may be a compensation mode to compensate for an absence of a load coupled to an output node of the circuitry.

The first mode may be a normal operating mode and the second mode may be an adjusted operating parameter operating mode.

In the adjusted operating parameter operating mode one or more operating parameters of the amplifier circuitry may be adjusted, in comparison with the first mode. The one or more operating parameters may comprise:
power consumption;
noise;
accuracy;
stability; and
output voltage.

The current limiter circuitry may comprise current mirror circuitry comprising:
the controllable switch device;
a second controllable switch device; and
a reference current source for generating a reference current,
wherein the current mirror circuitry is configured to mirror the reference current through the controllable switch device.

The current limiter circuitry may further comprise:
a third controllable switch device;
a controllable second current source for generating a second reference current; and
buffer circuitry,
wherein the current limiter circuitry is configured such that an output of the buffer circuitry toggles when a current through the third controllable switch device reaches a predetermined level.

The circuitry may further comprise a mode control switch configured to selectively couple a control terminal of the controllable switch device to a control voltage so as to cause the controllable switch device to operate in a fully on mode.

A control terminal of the mode control switch may be coupled to an output of the buffer circuitry.

The control terminal of the mode control switch may be coupled to the output of the buffer circuitry via delay circuitry.

The circuitry may further comprise:
detection circuitry configured to output a detection signal when a load voltage across a load coupled to the output node of the circuitry reaches a target voltage; and
delay circuitry configured to receive the detection signal and to output a control signal to deactivate current limiting by the current limiter circuitry after a predetermined delay period after receiving the detection signal.

The detection circuitry may be configured to:
compare the voltage generated and output by the amplifier circuitry to the load voltage across the load; and output the detection signal when the load voltage reaches the target voltage, wherein the target voltage is a predetermined value based on the voltage generated and output by the amplifier circuitry.

The delay circuitry may comprises digital delay circuitry.

The delay circuitry may comprises analogue delay circuitry.

The circuitry may comprise bias generator circuitry, regulator circuitry or reference voltage generator circuitry, for example.

According to a third aspect, the invention provides voltage generator circuitry comprising:
   amplifier circuitry configured to provide an output voltage to an output node of the voltage generator circuitry;
   a controllable switch device coupled between an output of the amplifier circuitry and the output node of the voltage generator circuitry, the controllable switch device being operable in a first, current limiting mode and a second, fully-on mode;
   detector circuitry configured to detect a voltage at the output node; and
   delay circuitry configured to output a control signal to cause the controllable switch device to switch from its first mode to its second mode after a predetermined delay following detection by the detector circuitry that the voltage at the output node has reached a threshold.

According to a fourth aspect, the invention provides circuitry for providing an output voltage, the circuitry comprising:
   amplifier circuitry configured to generate and output a voltage to a output node; and
   current limiter circuitry, wherein the current limiter is selectively operable to limit a current supplied at the output node,
   wherein the amplifier circuitry is dynamically reconfigurable in response to an indication that the current limiter circuitry has been activated.

According to a fifth aspect, the invention provides circuitry for providing an output voltage, the circuitry comprising:
   amplifier circuitry configured to generate the output voltage, the amplifier circuitry being operable in a first mode and a second mode; and
   a plurality of output nodes, each of the plurality of output nodes being coupled to an output of the amplifier circuitry by a respective one of a plurality of selectively activatable current limiters,
   wherein the circuitry is configured to force the amplifier circuitry to operate in its second mode in response to a first instance of a current limiter being activated.

According to a sixth aspect, the invention provides integrated circuitry comprising the circuitry of any one of the first to fifth aspects.

According to a seventh aspect, the invention provides device comprising the circuitry of any one of the first to fifth aspects.

The device may comprise, for example, a mobile telephone, a tablet or laptop computer, a smart speaker, an accessory device, headphones, earphones or earbuds.

BRIEF DESCRIPTION OF THE DRAWINGS

Embodiments of the invention will now be described, strictly by way of example only, with reference to the accompanying drawings, of which.

DETAILED DESCRIPTION

Figure 1A:
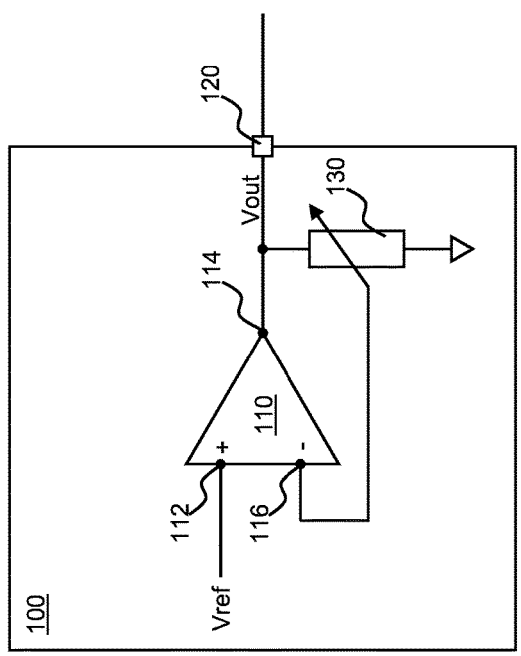
FIGS. 1a and 1b are schematic diagrams showing example voltage generator circuitry.
Figure 1B:
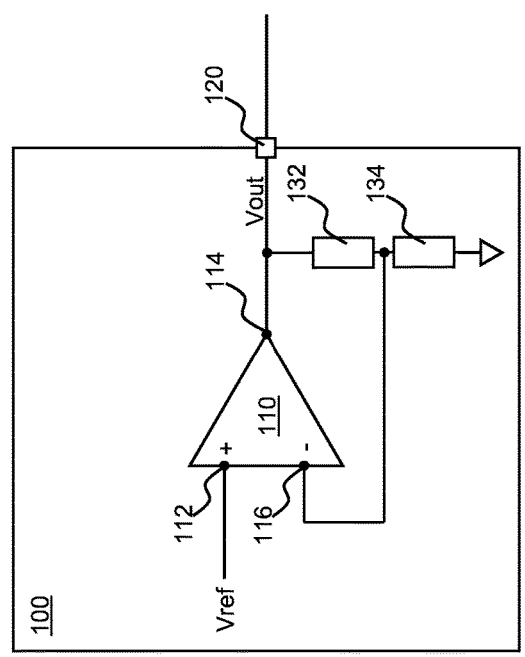

Referring first to FIGS. 1a and 1b, voltage generator circuitry for providing an output voltage (e.g. for use by downstream circuitry as a power supply, bias voltage, reference voltage or the like) at an output node is shown generally at 100. The voltage generator circuitry 100, illustrated in FIGS. 1a and 1b as non-inverting amplifier circuitry, may be implemented as one or more integrated circuits, for example.

The voltage generator circuitry 100 includes amplifier circuitry 110 configured to receive, at a first input node 112 thereof, a reference voltage Vref. The reference voltage Vref may be provided, for example, by a bandgap reference or the like.

The voltage generator circuitry 100 may include a variable resistance 130 in a feedback path between an output node 114 of the amplifier circuitry 110 and a second input node 116 of the amplifier circuitry 110, as shown in FIG. 1a. The variable resistance 130 governs a proportion of an output voltage of the amplifier circuitry 110 that is fed back to the second input node 114 and can be adjusted to provide a desired output voltage VOut.

Alternatively, as shown in FIG. 1b, the voltage generator circuitry 100 may include a potential divider comprising first and second fixed resistances 132, 134 in place of the variable resistance 130 of FIG. 1a in the feedback path between the output node 114 and the input node 116.

Figure 2:
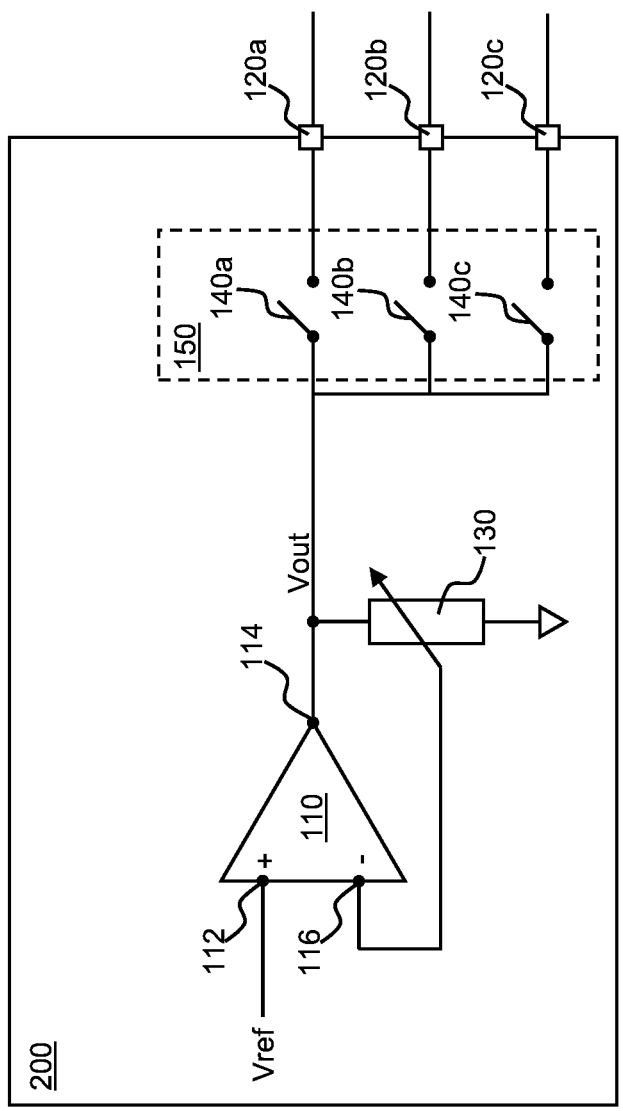
FIG. 2 is a schematic diagram showing example voltage generator circuitry having a plurality of output nodes and a plurality of controllable switch devices.

As shown in FIG. 2, in some examples voltage generator circuitry 200 may be provided with a plurality (three, in the illustrated example) of output nodes 120a, 120b, 120c, to permit multiple different loads to be supplied with the output voltage VOut. A switch network 150 comprising a plurality (also three, in the illustrated example) of controllable switching devices 140a, 140b, 140c, each associated with a respective one of the plurality of the output nodes 120a-120c, is provided to enable the output node 114 of the amplifier circuitry 110 to be selectively coupled to or decoupled from one or more of the output nodes 120a-120c, such that the output voltage VOut can be supplied to one or more respective loads coupled to the output nodes 120a-120c. Thus, by applying an appropriate control signal to a control terminal of one or more of the controllable switching devices 140a-140c the one or more controllable switch devices 140a-140c can be switched to a "fully on" state so as to couple the corresponding output node 120a-120c to the output node 114 of the amplifier circuitry 110 without significant current limiting by the controllable switch device 140a-140c. Similarly, by applying an appropriate control signal to a control terminal of one of the controllable switching devices 140a-140c the one or more controllable switch devices 140a-140c can be switched to an "off" state so as to decouple the corresponding output node 120a-120c from the output node 114 of the amplifier circuitry 110.

As will be appreciated by those of ordinary skill in the art, when a load is coupled to an output node 120a-120c of the circuitry 100, the current drawn by the load may initially be significantly higher than a steady-state current drawn by the load, until such time as the load has settled to its steady-state operating condition. This initial high current is known as inrush current, and can give rise to a temporary drop in the magnitude of the output voltage VOut (known as brownout).

For example, where a load is a capacitive load such as a capacitive transducer (e.g. a MEMS microphone), when the capacitive load is initially coupled to the output node 114 of the amplifier circuitry 110 via one of the output nodes 120a-120c, the capacitance of the capacitive load charges up rapidly, which can give rise to excessive current draw from the amplifier circuitry 110 and the associated problem of brownout.

To protect the amplifier circuitry 100 from brownout, each of the controllable switching devices 140a-140c may initially be controlled so as to operate in a current limiting operating mode, in which it couples the output node 114 of the amplifier circuitry 110 to the associated output node 120a-120c, but provides a relatively high resistance current path so as to limit the current drawn from the amplifier circuitry 114 by the load. Thus, each controllable switch device 140a-140c can be considered to be, or to act as, controllable current limiter circuitry.

Once the load has reached its steady state operating condition (e.g. when a capacitive load such as a capacitive transducer has fully charged up) the controllable switch device 140a-140c may switch to its "fully on" operating mode, in which it couples the output node 114 of the amplifier circuitry 110 to the associated output node 120a-120c, but provides a very low resistance current path, such that minimal limiting of the load current occurs.

In one example the controllable switching devices 140a-140c may be MOSFET devices. As will be familiar to those of ordinary skill in the art, the resistance between the drain and source terminals of a MOSFET device is effectively controlled by the voltage applied to the gate terminal of the device. Thus, by applying different voltages to the gate of a MOSFET device that is being used as a controllable switch device 140a-140c, the controllable switch device 140a-140c can be made to switch between a "current limiting" operating mode (in which the MOSFET is operational in its linear region and its drain-source resistance depends upon the applied gate voltage) and a "fully on" operating mode (in which the MOSFET is operational in its saturation region), thus deactivating current limiting by the controllable switch device 140a-140c. The controllable switch device 140a-140c can also be switched off, by applying a suitable gate-source voltage to the MOSFET.

As will be appreciated by those of ordinary skill in the art, it may be advantageous to provide a controllable switch device 140a-140c of the kind described above for selectively coupling the output node 114 of the amplifier circuitry 110 to an output node 120 even in examples of voltage generator circuitry 100 having only a single output node 120. For example, such an arrangement may be used to decouple a load from the output node 114 of the amplifier circuitry 110 for power saving purposes.

Figure 3:
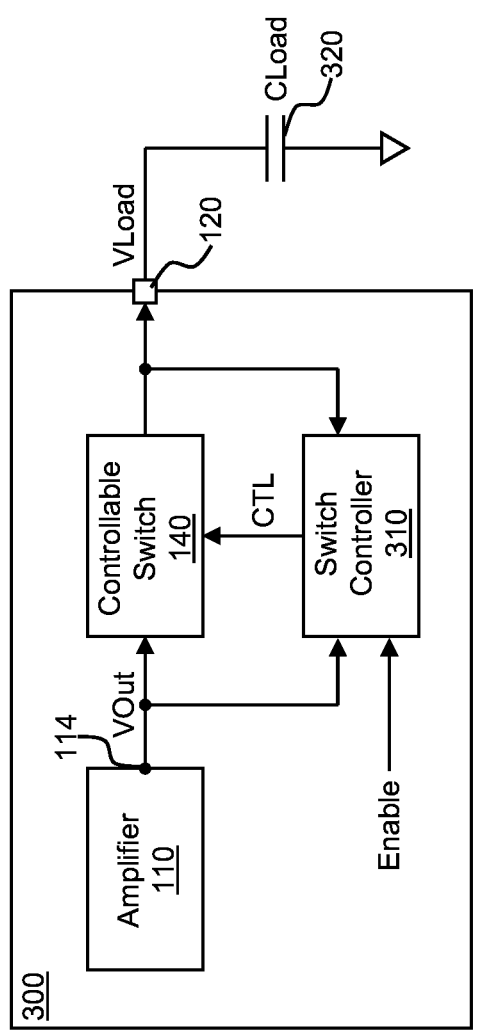
FIG. 3 is a schematic diagram showing example voltage generator circuitry having switch controller circuitry for controlling a mode of operation of a controllable switch.

FIG. 3 is a schematic diagram showing voltage generator circuitry having switch controller circuitry for controlling the mode of operation of a controllable switch based on a voltage across a load that is coupled to an output node of the voltage generator circuitry.

The voltage generator circuitry, shown generally at 300 in FIG. 3, is similar to the voltage generator circuitry 200 of FIG. 2, in that it includes amplifier circuitry 110 configured to supply an output voltage VOut to an output node 120 (or to a plurality of output nodes) via a controllable switch device 140 (or a switch network comprising a controllable switch device associated with each output node). For clarity, FIG. 3 shows only a single controllable switch device 140 and output node 120, but it is to be understood that the circuitry 300 could include a plurality of output nodes and associated controllable switch devices.

The voltage generator circuitry 300 differs from the voltage generator circuitry 200 in that it also includes switch controller circuitry 310 associated with the controllable switch device 140, which is operative to control a mode of operation of the controllable switch device 140 based (at least in part) on a voltage VLoad across a load 320. In the illustrated example the load 320 is a capacitive load such as a capacitive transducer (e.g. a MEMS microphone device), but it will be appreciated that other loads may also be coupled to the output node 120.

A first input node of the switch controller circuitry 310 is coupled to the output node 114 of the amplifier circuitry so as to receive the output voltage VOut that is output by the amplifier circuitry 110. A second input node of the switch controller circuitry 310 is coupled to the output node 120 so as to receive the voltage VLoad across the load 320. The switch controller circuitry 310 also receives an enable signal at a third input thereof, e.g. from controller circuitry such as a processor of a host device that incorporates the voltage generator circuitry 300.

When the enable signal is in a first logic state the switch controller circuitry 310 is operative to output a first control signal CTL to cause the controllable switch device 140 to switch off.

When the enable signal is in a second logic state the switch controller circuitry 310 outputs a second control signal CTL to the controllable switch device 140 to cause the controllable switch device 140 to operate in its current limiting mode until the voltage VLoad reaches a predetermined target or threshold value that indicates that the load 320 has almost reached its settled steady state operating condition. For example if the load 320 is a capacitive load such as a capacitive transducer that is biased by the output voltage VOut, the predetermined target or threshold value may be close to (e.g. 50 mV less than) a nominal value of the output voltage VOut.

When the voltage VLoad reaches the predetermined target or threshold value the control signal CTL output by the switch controller 310 to the controllable switch device 140 changes to a third control signal, to cause the controllable switch device 140 to operate in its fully on mode, thus deactivating current limiting by the controllable switch device 140.

Figure 4:
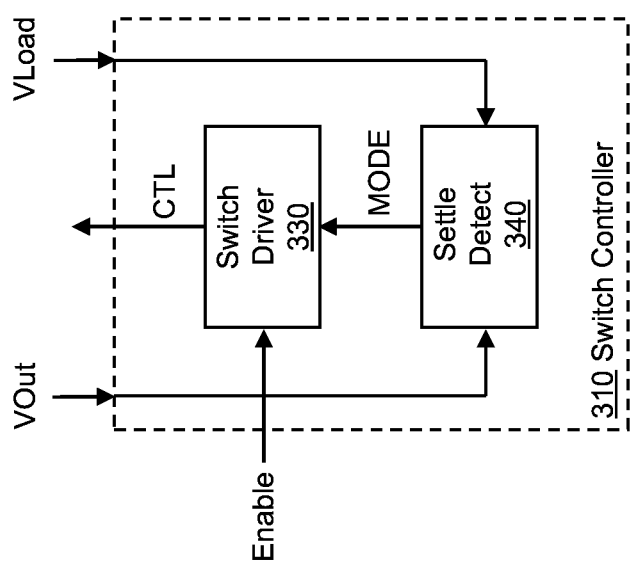
FIG. 4 is a schematic diagram illustrating functional blocks of the switch controller circuitry of FIG. 3.

FIG. 4 is a schematic diagram illustrating functional blocks of the switch controller circuitry 310.

As shown in FIG. 4, the switch controller circuitry 310 may include switch driver circuitry 330 that is operative to output the control signals CTL to the controllable switch device 140. The switch driver circuitry 330 may receive the enable signal and, as described above, output the first control signal to cause the controllable switch device 140 to switch off.

The switch controller circuitry 310 may also include settle detect circuitry 340, which is configured to receive the output voltage VOut of the amplifier circuitry 110 and the voltage VLoad across the load 320 and to output a mode control signal to the switch driver circuitry 330 to cause the switch driver circuitry 330 to output either the second control signal or the third control signal to the controllable switch device 140, depending on whether or not the voltage VLoad is indicative that the load 320 is close to its settled steady state operating condition.

Figure 5:
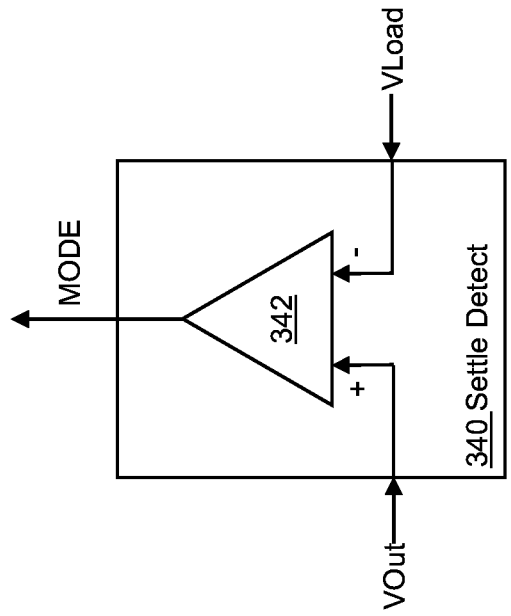
FIG. 5 is a schematic diagram illustrating example settle detect circuitry that may be used in the switch controller circuitry of FIGS. 3 and 4.

In one example, as shown in FIG. 5, the settle detect circuitry 340 comprises comparator circuitry 342 operative to receive the voltage VOut as a reference voltage at a first input node thereof and to receive the voltage VLoad at a second input node thereof.

In ideal comparator circuitry an output would toggle from a first state (e.g. 0V) to a second state (e.g. a higher voltage) when the voltage at the second input reaches the reference voltage at the first input. However, in a practical implementation it is not possible to ensure that the output will toggle as soon as the voltage at the second input reaches the reference voltage, and so to ensure that toggling of the output occurs the comparator circuitry 342 is designed such that the output toggles when the voltage at the second input comes rises to within some offset or threshold value of the reference voltage at the first input, e.g. when the voltage at the second input rises to within, say, 50 mV of the reference voltage.

Thus, in the comparator circuitry 342 of FIG. 5, while the voltage VLoad at the second input node is below a target or threshold Vth, an output voltage of the comparator circuitry 342 takes a first value, e.g. 0V. On detection of this first value the switch driver circuitry 330 outputs the second control signal to the controllable switch device 140 to cause the controllable switch device 140 to operate in its current limiting mode.

When the voltage VLoad reaches the predetermined target or threshold Vth (indicating that the load has almost reached its settled steady state operating condition), the output voltage of the comparator circuitry 342 changes to a second value (e.g. the output voltage changes from 0V to a relatively higher output voltage). On detection of this change in the output voltage of the comparator circuitry 342, the switch driver circuitry 330 outputs the third control signal to the controllable switch device 140 to cause the controllable switch device 140 to operate in its fully on mode, thus deactivating current limiting by the controllable switch device 140.

One problem that can arise in the arrangement described above with reference to FIGS. 3-5 is that, because comparator circuitry 342 is designed such that its output toggles when the load has almost reached its settled steady-state operating condition (i.e. before the voltage VLoad across the load is equal to the voltage VOut output by the amplifier circuitry 110), when the controllable switch device 140 starts operating in its fully on mode (i.e. without significant current limiting) there can be a relatively large spike of inrush current until the load 320 reaches its settled steady-state operating condition.

For example, where the load 320 is a capacitive load such as a capacitive transducer, the output of the comparator circuitry 342 will toggle before the load capacitance is fully charged, and thus there can be an inrush current spike when the controllable switch device 140 starts operating without significant current limiting.

Figure 6:
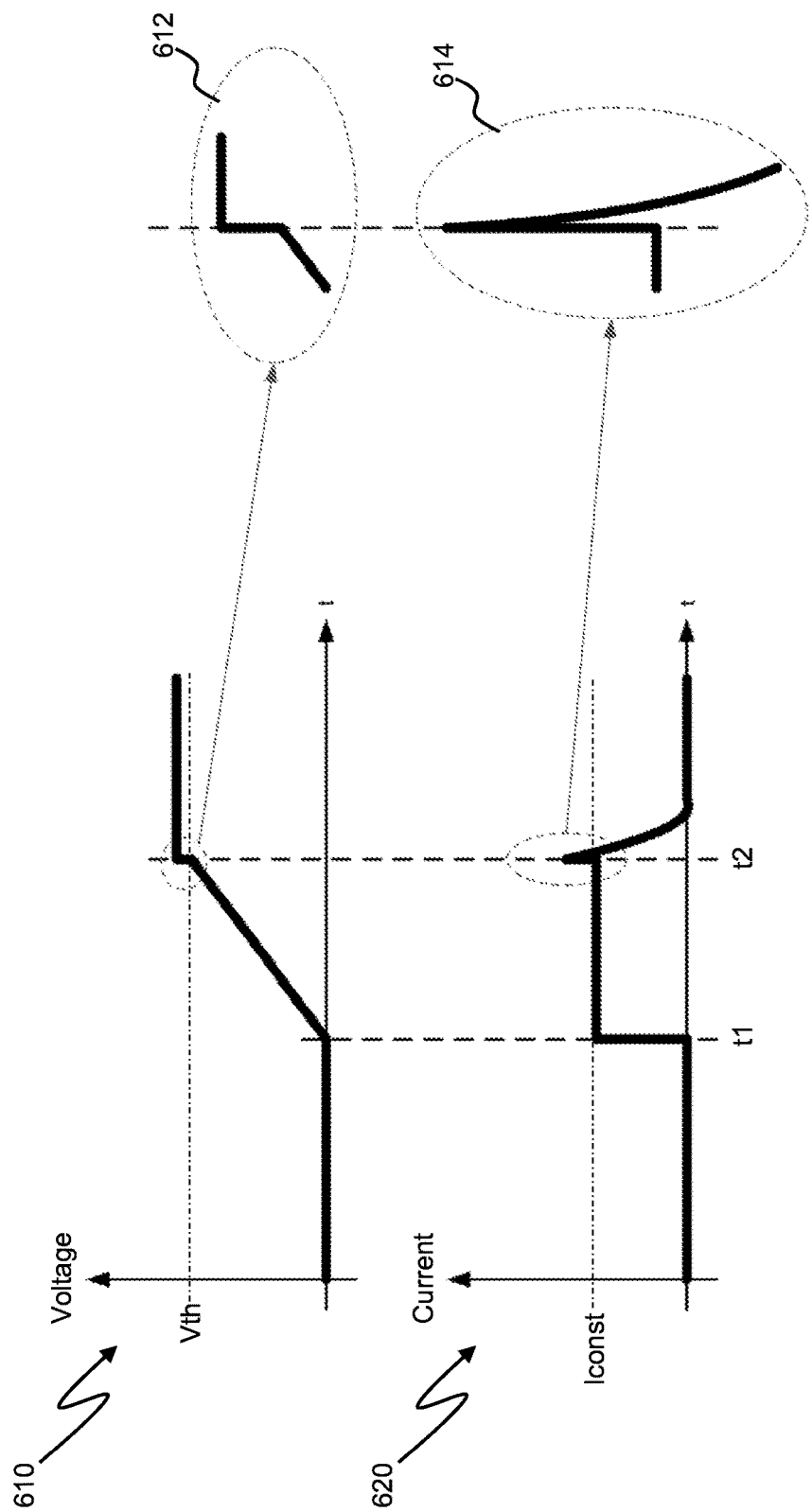
FIG. 6 illustrates a voltage across a load coupled to an output node of the circuitry of FIG. 3 and a current through the load when current limiting is disabled.

This effect is illustrated in FIG. 6, which shows, in the uppermost trace 610, the voltage VLoad across the load 320 and, in the lowermost trace 620, the current in the load 320.

At a time t1, the enable signal for a controllable switch device 140 associated with an output node 120 to which the load is coupled is asserted, i.e. transitions from logic low to logic high. The controllable switch device 140 commences operating in its current limiting mode, such that a constant current Iconst is supplied to the load 320, causing the voltage VLoad across the load 320 to increase at a constant rate.

At time t2 the voltage VLoad reaches the target or threshold Vth, causing the output of the settle detect circuitry 342 to toggle, which in turn causes the switch driver circuitry to output the third control signal to the controllable switch device 140 to cause the controllable switch device 140 to switch to its fully on mode, thus deactivating current limiting by the controllable switch device 140.

As a result of change of the operating mode of the controllable switch device 140 and the absence of any significant current limiting, the current through the load increases rapidly until the load 320 has reached its settled steady-state operating condition (e.g. a capacitance of the load 320 has fully charged), as shown in the magnified portions 612, 614 of FIG. 6.

This sudden current spike can lead to a drop in the output voltage VOut of the amplifier circuitry 110, which can in turn give rise to noticeable artefacts in loads that are coupled to the output node(s) 120 of the voltage generator circuitry 300, e.g. audible artefacts in systems incorporating capacitive microphone devices, for example, that are coupled to output nodes of the voltage generator circuitry.

To address this problem embodiments of the present disclosure introduce a delay between the voltage VLoad reaching the target or threshold Vth and the controllable switch device 140 switching to its fully on mode of operation, thus deactivating current limiting by the controllable switch device 140, as will now be described with reference to FIG. 7.

Figure 7:
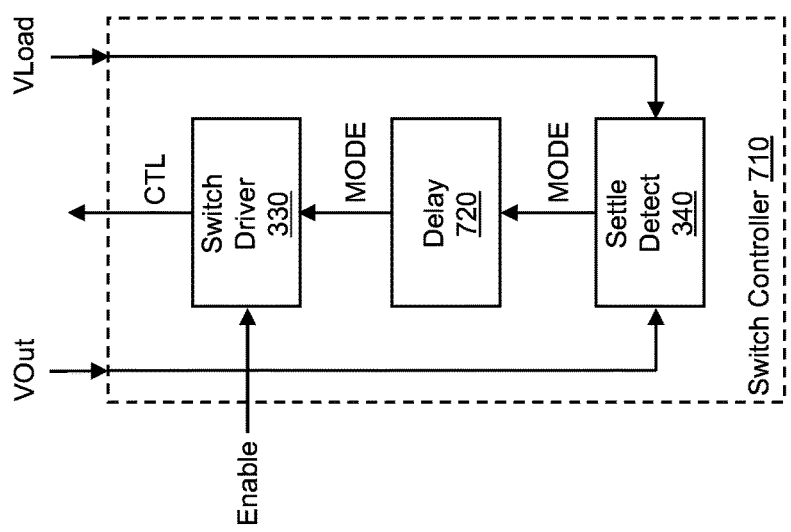
FIG. 7 is a schematic diagram illustrating functional blocks of switch controller circuitry that forms part of voltage generator circuitry according to embodiments of the present disclosure.

FIG. 7 is a schematic diagram illustrating functional blocks of switch controller circuitry that forms part of voltage generator circuitry according to embodiments of the present disclosure.

The switch controller circuitry (shown generally at 710 in FIG. 7) forms part of voltage generator circuitry of the kind described above with reference to FIG. 3, and is similar to the switch controller circuitry 310 illustrated in FIGS. 3 and 4, in that it includes switch driver circuitry 330 and settle detect circuitry 340, which configured to output a mode control signal to the switch driver circuitry 330 to cause the switch driver circuitry 330 to output either the second control signal or the third control signal to the controllable switch device 140.

However, the switch controller circuitry 710 of FIG. 7 differs from the switch controller circuitry 310 in that it includes delay circuitry 720 coupled between the settle detect circuitry 340 and the switch driver circuitry 330.

The delay circuitry is configured to receive the mode control signal output by the settle detect circuitry 340 and to output a corresponding mode control signal to the switch driver circuitry 330 after a predetermined delay period after receiving the mode control signal output by the settle detect circuitry 340.

The delay introduced by the delay circuitry 720 allows sufficient time for the load 320 to reach its settled steady state operating condition (e.g. allows sufficient time for a capacitive load 320 to charge up fully) before the operating mode of the controllable switch device 140 changes to its fully on mode, thus deactivating current limiting by the controllable switch device 140. Thus the spike in the load current and the consequential drop in the amplifier output voltage described above do not occur.

The delay circuitry 720 may be digital delay circuitry or analogue delay circuitry. In a simple implementation the delay circuitry may be configured to introduce a predetermined delay of fixed duration. The duration may be selected to accommodate an expected range of loads (e.g. an expected range of load capacitances), so as to ensure that any load within the expected range will have time to reach its settled steady state operating condition before the controllable switch device 140 switches to its fully on mode, thus deactivating current limiting by the controllable switch device 140.

Alternatively, the duration of the delay introduced by the delay circuitry may be variable, based, for example, on an expected capacitance value of load 320, such that the delay introduced by the delay circuitry can be tailored to the load 320. For example, a register of delay values for particular load capacitance values or ranges of load capacitances may be provided (e.g. in a memory of the voltage generator circuitry 300 or a memory of a host device incorporating the voltage generator circuitry 300), from which an appropriate delay value may be selected.

The amplifier circuitry 110 may be configured to be operable in a first operating mode (also referred to as a normal mode) when a load is coupled to the output node 120 and in a second operating mode (which may be a compensation mode), different than the first operating mode, when no load is coupled to the output node 120. In the second operating mode 110 the amplifier circuitry 110 compensates for the absence of a load coupled to the output node 120, in order to continue to operate correctly and/or to maintain a desired stability, noise performance, accuracy, power consumption, output voltage or some other operating parameter of the amplifier circuitry 110.

For example, where the amplifier circuitry 110 is, or is part of, bias voltage generator circuitry for biasing a capacitive component such as a capacitive transducer that may be coupled to the output node 120, the amplifier circuitry 110 may be configured to operate in a first mode when a capacitive load is coupled to the output node 120 and to operate in a second node when a capacitive load is not coupled to the output node 120. In the second mode the amplifier circuitry 110 compensates for the absence of an external capacitance coupled to the output node 120 in order to maintain stability. For example, in the second operating mode components internal to the amplifier circuitry 110 may be reconfigured (e.g. switched into or out of operation) in order to provide or move one or more poles in the transfer function of the amplifier circuitry 110, in order to compensate a change in the expected transfer function of the amplifier circuitry 110 arising from the absence of an external capacitance coupled to the output node 120.

In another example, where the amplifier circuitry 110 is, or is part of, low dropout regulator (LDO) circuitry for providing a regulated output voltage at the output node 120, the amplifier circuitry 110 may be configured to operate in a first mode when a load is coupled to the output node 120 and to operate in a second node when a load is not coupled to the output node 120. In the second mode the amplifier circuitry 110 compensates for the absence of an external load (e.g. an external resistive load) coupled to the output node 120 in order to maintain correct operation of the LDO. For example, in the second operating mode one or more resistances internal to the amplifier circuitry 110 may be coupled to the output node 120, to compensate for the absence of an external load coupled to the output node 120.

As will be appreciated by those of ordinary skill in the art, the amplifier circuitry 110 may compensate for the absence of the external load in a number of different ways, e.g. by enabling and/or disabling (e.g. switching in/out) internal components such as capacitances, resistances and transistors, and/or by adjusting operating parameters such as gain, tail current and the like of or associated with internal components or with the amplifier circuitry 110 as a whole.

Thus, the amplifier circuitry 110 may be dynamically reconfigurable, for example to compensate for the absence of an expected load at the output node 120, or to adjust an operating parameter such as power consumption, noise, output voltage, accuracy or the like of the amplifier circuitry 110. The amplifier circuitry 110 may be configured to switch between the first and second operating modes (i.e. to reconfigure itself) in response to a mode control signal received, for example, from control circuitry of a host device that incorporates the amplifier circuitry 110.

In some examples the operating mode of the amplifier circuitry 110 may be pre-set by a user during an initial configuration of the amplifier circuitry 110, according to the requirements of the system in which it is to be used. For example, if the system includes a capacitance, external to the amplifier circuitry 110, coupled to the output node 120, then the amplifier circuitry 110 is pre-set to operate in the first mode during an initial configuration by the user. In contrast, if no external capacitance is provided, the amplifier circuitry 110 is pre-set to operate in the second mode during an initial configuration by the user.

In other examples the operating mode of the amplifier circuitry 110 may be determined by the amplifier circuitry 110 itself, or by circuitry external to the amplifier circuitry 110, according to operational requirements such as noise performance, power consumption, accuracy, output voltage or the like.

The amplifier circuitry 110 may have a default mode of operation. The first mode of operation or the second mode of operation may be the default mode of operation, according to the requirements of the particular application of the amplifier circuitry 110, and the amplifier circuitry 110 may be configured to revert to its default mode of operation when current limiting has been disabled, or when some other condition has been satisfied.

In some examples of the circuitry 300 described above, the operating mode of the amplifier circuitry 110 can be changed based on the state of the controllable switch device 140.

When the controllable switch device 140 is operating in its current limiting mode, the external load 320 that is coupled to the output node 120 may not be "seen" by the amplifier circuitry 110, or may not appear to be the expected external load. This can give rise to issues such as instability, reduced noise performance, incorrect output voltage and the like in the amplifier circuitry 110.

For example, where the circuitry 300 is for supplying a voltage (e.g. a bias voltage) to a capacitive load, when the controllable switch device 140 is operating in its current limiting mode, the amplifier circuitry 110 may become unstable because the expected external capacitive load is not "seen" by the amplifier circuitry 110.

To mitigate such issues, embodiments of the present disclosure may be configured to cause an operating mode of the amplifier circuitry 110 to change when the controllable switch device 140 is operating in its current limiting mode, as will now be described with reference to FIG. 8.

Figure 8:
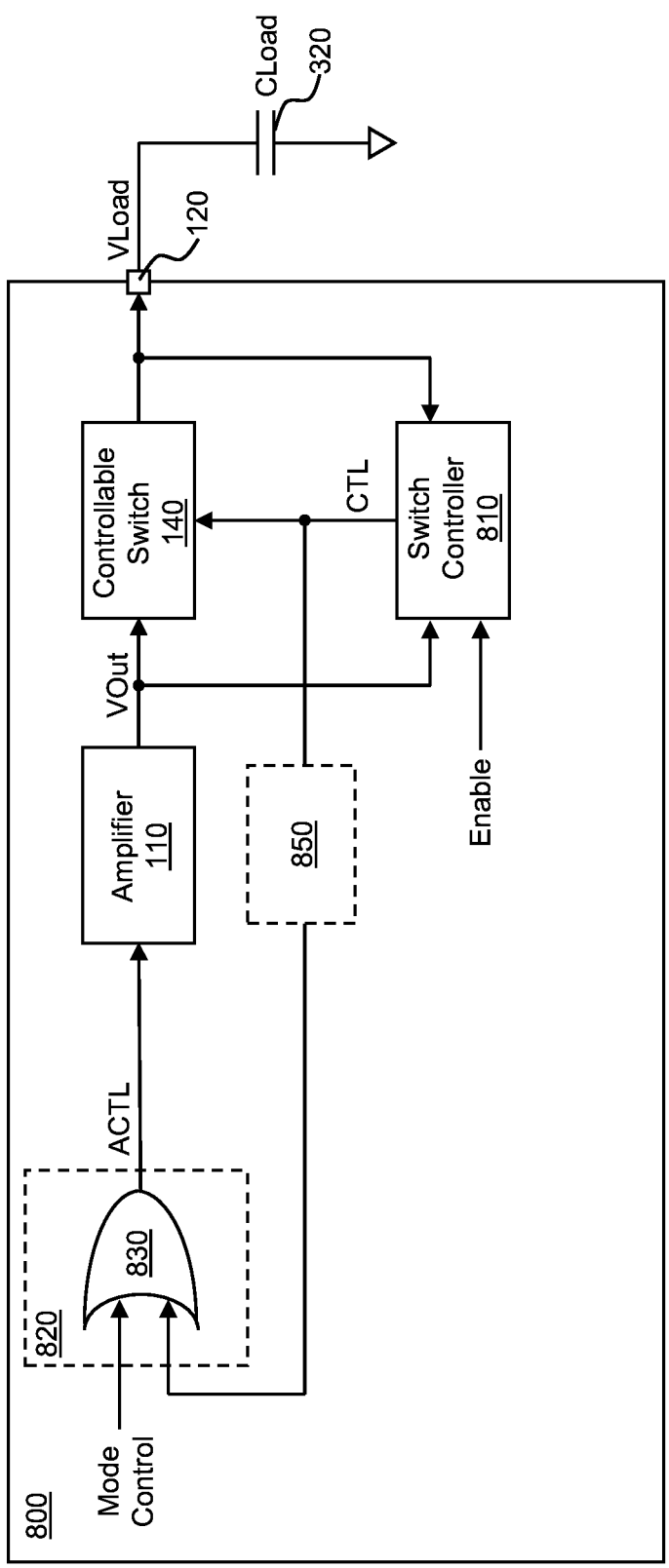
FIG. 8 is a schematic diagram showing voltage generator circuitry having logic circuitry for controlling a mode of operation of amplifier.

FIG. 8 is a schematic diagram showing voltage generator circuitry having logic circuitry for controlling a mode of operation of amplifier.

The voltage generator circuitry, shown generally at 800 in FIG. 8, is similar to the voltage generator circuitry 300 illustrated in FIG. 3, in that it includes amplifier circuitry 110 configured to supply an output voltage VOut to an output nodes 120 (or to a plurality of output nodes) via a controllable switch device 140 (or a switch network comprising a controllable switch device associated with each output node). As in FIG. 3, for clarity, FIG. 8 shows only a single controllable switch device 140 and output node 120, but it is to be understood that the circuitry 800 could include a plurality of output nodes and associated controllable switch devices.

The circuitry 800 further includes switch controller circuitry 810, which may be switch controller circuitry 310 of the kind described above with reference to FIG. 4, or alternatively may be switch controller circuitry 710 of the kind described above with reference to FIG. 7, which includes delay circuitry 720.

The circuitry 800 further includes logic circuitry 820 configured to output a control signal ACTL for controlling an operating mode of the amplifier circuitry 110 such that when the controllable switch device 140 is operating in its current limiting mode the amplifier circuitry 110 operates in its second mode.

In the illustrated example the logic circuitry includes an OR gate 830, configured to receive at a first input thereof a mode control signal from, e.g., control circuitry of a host device that incorporates the circuitry 800. The OR gate 830 is further configured to receive, at a second input thereof, a logic signal output by the switch controller circuitry 810 (if necessary via intermediate analogue or digital circuitry 850 such as buffer circuitry) so as to receive an input signal based on the control signal CTL output by the switch controller circuitry 810.

The OR gate 830 outputs a logic 1 as the control signal ACTL if a logic 1 is received at either of its inputs. In response to receiving a logic 1 as the control signal ACTL the amplifier circuitry 110 switches from its normal mode of operation to its compensation mode of operation.

As will be apparent, the amplifier circuitry 110 can be caused to operate in its second mode either by an appropriate mode control signal (issued, for example, by control circuitry of a host device), or by a signal based on the control signal CTL output by the switch controller circuitry 810. Thus, if the switch controller circuitry 810 outputs a control signal CTL to cause the controllable switch device 140 to operate in its current limiting mode, an appropriate control signal ACTL can be output by the logic circuitry 810 to cause the amplifier circuitry 110 to operate in its second mode.

In this way the amplifier circuitry 110 is able to dynamically reconfigure itself, e.g. to compensate for the absence of an expected load at the output node 120, when the controllable switch device 140 is operating in its current limiting mode, thereby ensuring correct or desired operation of the amplifier circuitry 110 (in terms of stability, noise performance, accuracy, power consumption, output voltage or another operating parameter) when current to the load 320 is limited.

As discussed above, in some examples the amplifier circuitry 110 may provide the output voltage VOut to a plurality of output nodes via controllable switching devices or current limiter circuitry associated with each output node.

Figure 9:
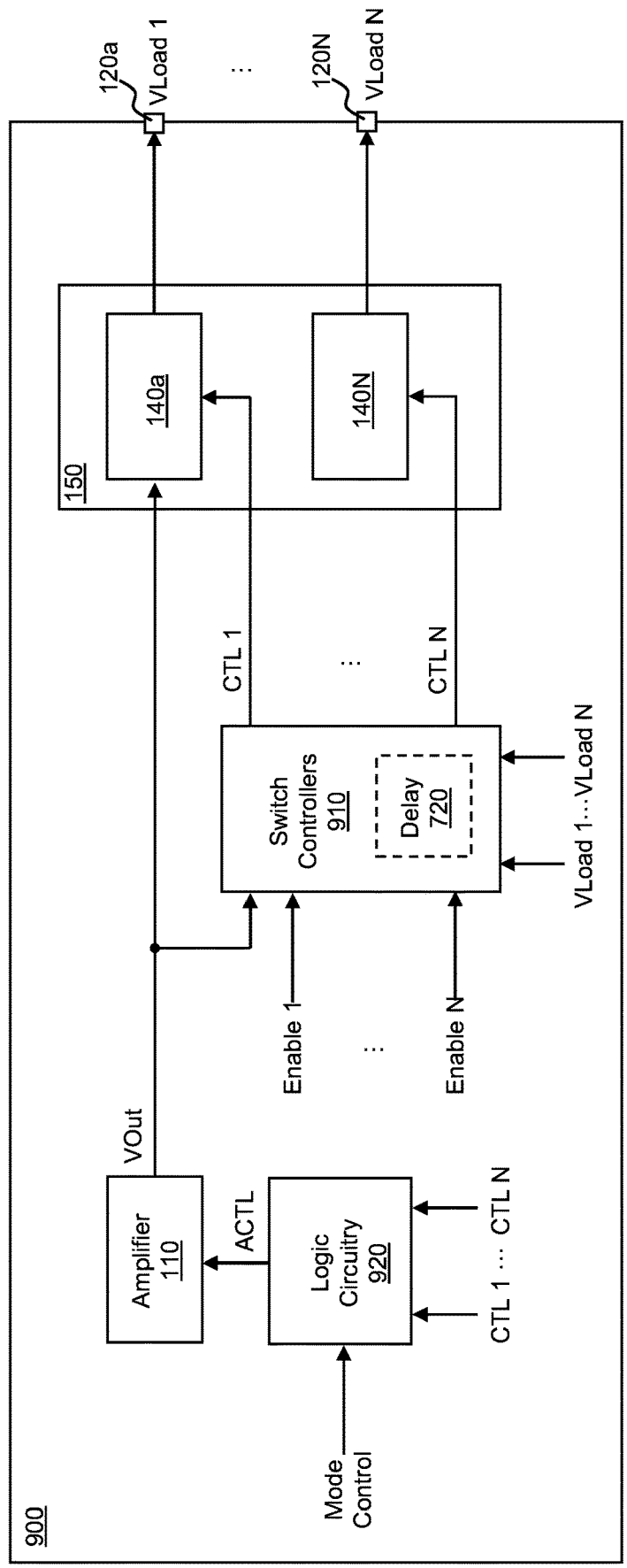
FIG. 9 is a schematic diagram showing voltage generator circuitry 900 having a plurality of output nodes.

FIG. 9 is a schematic diagram showing voltage generator circuitry 900 having a plurality of output nodes 120a-120N. The voltage generator circuitry 900 includes a switch network 150 comprising a plurality of controllable switch devices 140a-140N of the kind described above with reference to FIGS. 2 and 3, each associated with a respective one of the plurality of output nodes 120a-120N.

The voltage generator circuitry 900 further includes switch controller circuitry 910 for each controllable switch device 140a-140N, operative to control each of the plurality of controllable switch devices 140a-140N in the manner described above. Specifically, the switch controller circuitry 910 is operative to output controls signals CTL 1-CTL N to the respective controllable switching devices 140a-140N based on the voltage at the respective output nodes 120a-120N. The switch controller circuitry 910 may include delay circuitry 720 of the kind described above for each controllable switch device 140a-140N to delay the outputting of the control signals CTL 1-CTL N.

The voltage generator circuitry may further include logic circuitry 920 operative to receive the control signals CLT 1-CTL N output by the switch controller circuitry 910 and a mode control signal issued, for example, by control circuitry of the host device, and to output an amplifier control signal ACTL to the amplifier circuitry 110 to control the mode of operation of the amplifier circuitry 110.

The logic circuitry 910 is configured such that if one of the controllable switch devices 140a-140N (e.g. controllable switch device 140a) begins to operate in its current limiting mode, a control signal ACTL is output to cause the amplifier circuitry 110 to switch to its compensation mode of operation. Once the controllable switch device 140a ceases operating in its current limiting mode (because the load coupled to the associated output node 120a has reached its settled steady state operating condition) the logic circuitry 920 changes the control signal ACTL so as to cause the amplifier circuitry 110 to resume operation in its normal mode.

If any of controllable switching devices 140a-140N subsequently begins operating in its current limiting mode, the amplifier circuitry 110 can continue to operate in its normal mode, since it can "see" an expected load coupled to the output node 120a and thus operation of any of the controllable switching devices 140a-140N in its current limiting node should not give rise to any operational or performance issues in the amplifier circuitry 110.

Thus, the logic circuitry 920 may be configured to ignore any control signal CTL 1-CTL N received after the amplifier circuitry 110 has resumed operation in its normal operating mode that would otherwise cause the logic circuitry 920 to issue a control signal ACTL to cause the amplifier circuitry 110 to enter its compensation mode of operation. To achieve this the logic circuitry 920 may include appropriate circuitry such as latch circuitry, clamp circuitry or the like, as will be readily apparent to those of ordinary skill in the art.

Figure 10:
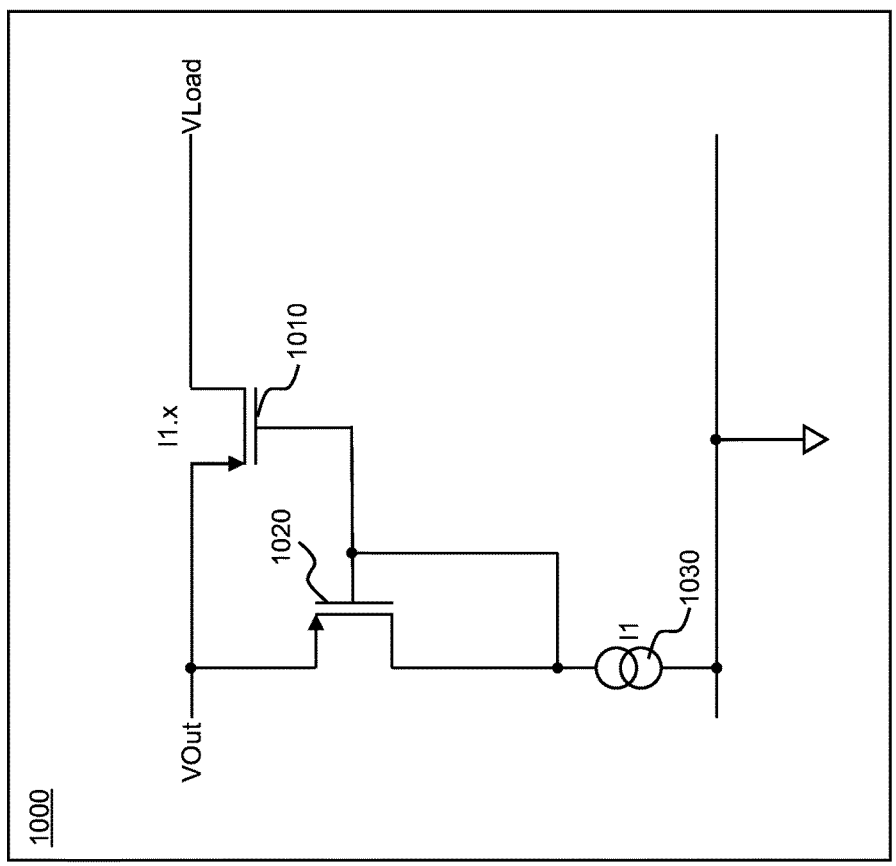
FIG. 10 is a schematic diagram showing current limiting switch circuitry.

Referring now to FIG. 10, example current limiting switch circuitry suitable for use in the circuitry 300, 800, 900 of the present disclosure is shown generally at 1000. The current limiting switch circuitry 1000 includes a first transistor 1010, a second transistor 1020, and a current source 1030. The first transistor 1010 may be used as the controllable switch device 140 in the circuitry 300, 800, 900.

A source terminal of the first transistor 1010 is coupled so as to receive the voltage VOut output by the amplifier circuitry 110, and a drain terminal of the first transistor is coupled to the output node 120 so as to receive the voltage VLoad across the load 320. A gate terminal of the first transistor 1010 is coupled to a gate terminal of the second transistor 1020 and to the current generator 1030. A drain terminal of the second transistor 1020 is also coupled to the current generator 1030, whilst a source terminal of the second transistor 1020 is coupled so as to receive the voltage VOut output by the amplifier circuitry 110.

Thus, as will be apparent to those of ordinary skill in the art, the current limiting switch circuitry 1000 of FIG. 10 is a current mirror, in which a current I1 through the current source 1030 is mirrored through the second transistor 1020 to the first transistor 1010 and multiplied by a factor x, so to limit output current to the load to I1.x The factor x is a ratio of the width/length ratio of the first transistor 1010 to the width/length ratio of the second transistor 1020. Thus, the current limit can be defined by appropriate selection of the current I and the width/length ratios of the first and second transistors 1010 and 1020.

Figure 11:
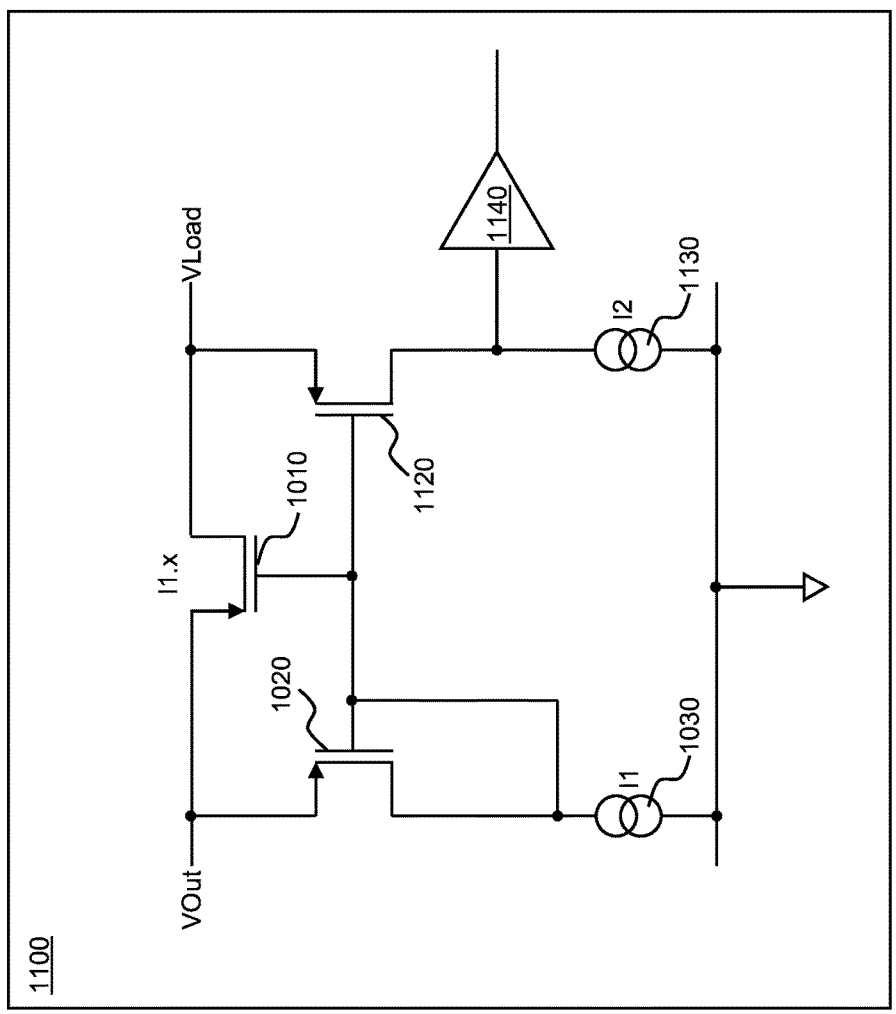
FIG. 11 is a schematic diagram illustrating current limiting switch circuitry incorporating settle detect circuitry.

FIG. 11 is a schematic diagram illustrating current limiting switch circuitry incorporating settle detect circuitry. The example circuitry shown generally at 1100 in FIG. 11 is similar to the circuitry 1000 of FIG. 10, and includes first and second transistors 1010, 1020 and a first current source 1030 coupled and operative in the same manner as the equivalent elements of the circuitry 1000.

The circuitry 1100 of FIG. 11 further includes a third transistor 1120, which in this example is also a PMOS device, a programmable second current source 1130 and buffer circuitry 1140.

A gate terminal of the third transistor 1120 is coupled to the gate terminals of the first and second transistors 1010, 1020, and a source terminal of the third transistor 1120 is coupled to the output node 120 so as to receive the voltage VLoad across the load 320. A drain terminal of the third transistor 1120 is coupled to the second current source, and the buffer circuitry 1140 is coupled to a node intermediate the drain terminal of the third transistor 1120 and the second current source 1130.

At the voltage VLoad increases from 0 towards VOut, the gate-source voltage Vgs3 of the third transistor 1120 will approach the gate-source voltage VGs2 of the second transistor 1020. The current through the third transistor 1120 will approach the current through the second transistor 1020.

The programmable second current source 1130 is configured to supply a current I2 which balances the current through the third transistor 1120 at a trigger point of the buffer circuitry 1140. Thus, when the current through the third transistor 1120 increases to the point that it matches the current I2 supplied by the programmable second current source 1130 as a result of the increasing voltage VLoad, the output of the buffer circuitry 1140 toggles. The output of the buffer circuitry 1140 can be used to switch the circuitry 1100 out of current limiting mode, either directly or via delay circuitry.

Figure 12:
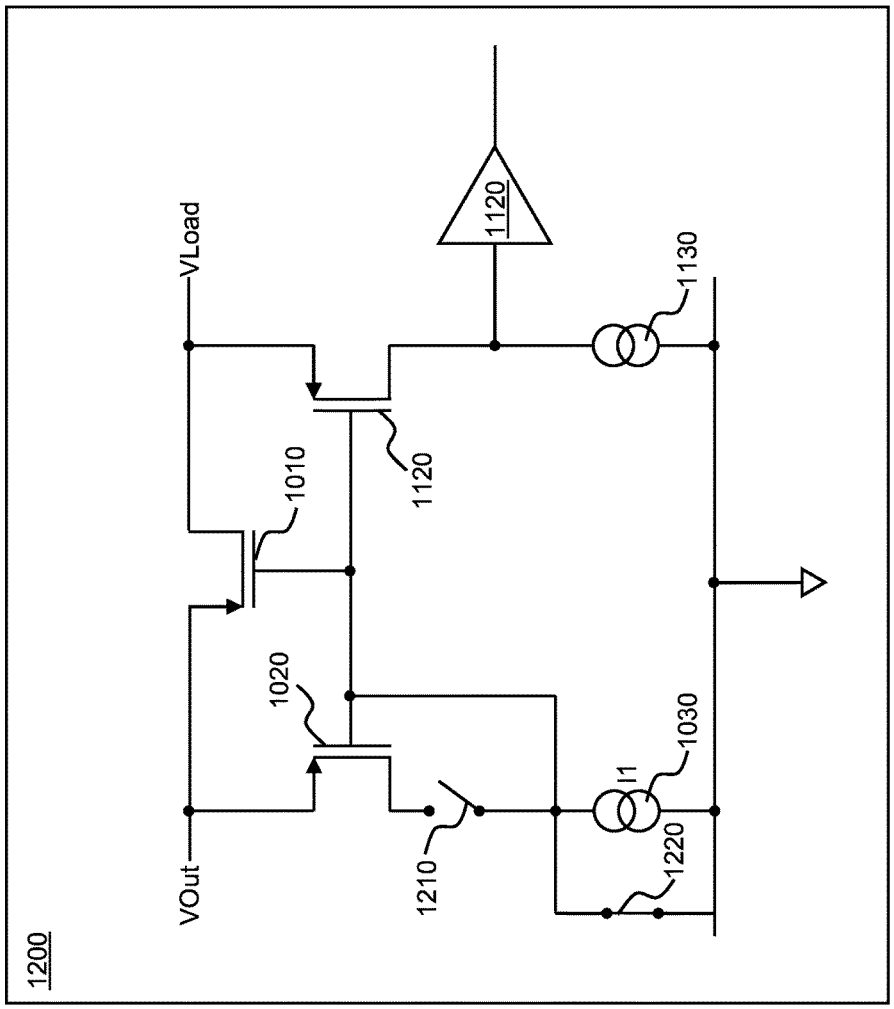
FIG. 12 is a schematic diagram illustrating current limiting switch circuitry incorporating settle detect circuitry and switching circuitry to control the current limiting operation of the circuitry.

FIG. 12 is a schematic diagram illustrating current limiting switch circuitry incorporating settle detect circuitry and switching circuitry to control the current limiting operation of the circuitry. The circuitry, shown generally at 1200 in FIG. 12 is similar to the circuitry 1100 of FIG. 11, with the exception that it includes a first controllable mode control switch 1210 coupled between the drain terminal of the second transistor 1020 and the current source 1030 and a second controllable mode control switch 1220 coupled in parallel with the current source 1030.

When the circuitry 1200 is operative in a current limiting mode, the first controllable switch 1210 is closed and the second controllable mode control switch 1220 is opened. In this configuration the circuitry 1200 operates as described above with reference to FIG. 11 to limit the current through the first transistor 1010.

To disable current limiting in the circuitry 1200, the first controllable switch 1210 is opened and the second controllable mode control switch 1220 is closed (as shown). In this configuration the gate of the first transistor 1010 is pulled to ground and thus the first transistor 1010 is turned hard on, i.e. the first transistor 1010 operates in the "fully on" operating mode discussed above. Opening the first controllable switch 1210 disconnects the drain of the second transistor 1020, thus preventing the second transistor 1020 from haemorrhaging current.

Control terminals of the first controllable switch 1210 and the second controllable mode control switch 1220 may be coupled, via delay circuitry 720 if necessary, to the output of the buffer circuitry 1120 such that the first transistor 1010 (i.e. the controllable switching device 140 described above) is caused to operate in its "fully on" operating mode in response to the output of the buffer circuitry 1120 toggling. Thus the circuitry 1200 can be configured such that current limiting is automatically disabled when the voltage VLoad across the load 320 rises to a target voltage, which may be a predetermined value based on the voltage VOut provided by the amplifier circuitry 110 (e.g. when the load voltage VLoad rises to a level that is within a threshold or offset of the voltage VOut output by the amplifier circuitry 110), either immediately or after a delay introduced by delay circuitry 720.

As will be apparent from the discussion above, the present disclosure provides a mechanism for preventing, or at least limiting, a current spike in a load coupled to voltage generator circuitry when current limiter circuitry of the voltage generator circuitry is deactivated or disabled. The present disclosure further provides a mechanism for changing an operating parameter of amplifier circuitry that forms part of the voltage generator circuitry when current limiting is applied to the output of the amplifier circuitry, e.g. to achieve or maintain a desired stability, noise performance, power consumption, accuracy or other operating parameter.

The voltage generator circuitry of the present disclosure can be used in a variety of applications. For example, the voltage generator circuitry may be, or may form part of, bias voltage generator circuitry for providing a bias voltage, regulator circuitry such as LDO circuitry for providing a regulated supply voltage, or reference voltage generator circuitry for providing one or more reference voltages.

The discussion above describes the use of controllable switching devices as current limiter circuitry. It will be appreciated by those of ordinary skill in the art that alternative current limiter circuitry may be used instead of the controllable switching devices described above. Thus the present disclosure encompasses any other current limiter circuitry and is not limited to the use of controllable switching devices as current limiter circuitry.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for providing an output voltage, the circuitry comprising:
    voltage generator circuitry configured to provide an output voltage to an output node of the circuitry;
    current limiter circuitry operable to perform current limiting so as to limit a current supplied at the output node of the circuitry;
    detection circuitry configured to output a detection signal when a load voltage across a load coupled to the output node of the circuitry reaches a target voltage; and
    delay circuitry configured to receive the detection signal and to output a control signal to deactivate current limiting by the current limiter circuitry after a predetermined delay period after receiving the detection signal;
    wherein the detection circuitry is configured to:
        compare the output voltage provided by the voltage generator circuitry to the load voltage across the load; and output the detection signal when the load voltage reaches the target voltage, wherein the target voltage is a predetermined value based on the output voltage provided by the voltage generator circuitry.

2. The circuitry according to claim 1, wherein the current limiter circuitry comprises a controllable switch device.

3. The circuitry according to claim 1, wherein the voltage generator circuitry comprises amplifier circuitry.

4. The circuitry according to claim 3, wherein the amplifier circuitry is selectively operable in a first operating mode and a second operating mode.

5. The circuitry according to claim 4, wherein the amplifier circuitry is operative in the second operating mode when the current limiter circuitry is activated to limit the current supplied at the output node.

6. The circuitry according to claim 4, further comprising logic circuitry configured to detect activation of the current limiter circuitry and, in response to detecting activation of the current limiter circuitry, to output a control signal to the amplifier circuitry to cause the amplifier circuitry to operate in its second operating mode, wherein the logic circuitry is further configured to detect deactivation of the current limiter circuitry, and, in response to detecting deactivation of the current limiter circuitry, to output a control signal to the amplifier circuitry to cause the amplifier circuitry to operate in its first operating mode.

7. The circuitry according to claim 4, wherein the first operating mode is a normal, default or preconfigured operating mode of the amplifier circuitry and the second operating mode is a compensation mode to compensate for an absence of a load coupled to an output node of the amplifier circuitry.

8. The circuitry according to claim 4, wherein the first operating mode is a normal operating mode and the second operating mode is an adjusted operating parameter operating mode, wherein in the adjusted operating parameter operating mode one or more operating parameters of the amplifier circuitry is adjusted, in comparison with the first operating mode, wherein the one or more operating parameters comprise:
power consumption;
noise;
accuracy;
stability; and
output voltage.

9. The circuitry according to claim 1, wherein the circuitry comprises a plurality of output nodes, each output node being associated with respective current limiter circuitry.

10. The circuitry according to claim 9, wherein:
the voltage generator circuitry comprises amplifier circuitry;
the amplifier circuitry is selectively operable in a first operating mode and a second operating mode; and
the amplifier is operative in the second operating mode when the current limiter circuitry associated with any one of the plurality of output nodes is activated to limit the current supplied at the output node.

11. The circuitry according to claim 10, further comprising logic circuitry configured to detect activation of the current limiter circuitry associated with any one of the plurality of output nodes and, in response to detecting activation of the current limiter circuitry, to output a control signal to the amplifier circuitry to cause the amplifier circuitry to operate in its second operating mode, wherein the logic circuitry is further configured to detect deactivation of the current limiter circuitry associated with the one of the plurality of output nodes, and, in response to detecting deactivation of the current limiter circuitry, to output a control signal to the amplifier circuitry to cause the amplifier circuitry to operate in its first operating mode.

12. The circuitry according to claim 11, wherein the logic circuitry is further configured not to output a control signal to the amplifier circuitry to cause the amplifier circuitry to operate in its second operating mode in response to detection of a subsequent activation of the current limiter circuitry associated with any one of the plurality of output nodes.

13. The circuitry according to claim 2, wherein the current limiter circuitry comprises current mirror circuitry comprising:
the controllable switch device;
a second controllable switch device; and
a reference current source for generating a reference current,
wherein the current mirror circuitry is configured to mirror the reference current through the controllable switch device.

14. The circuitry according to claim 13, wherein the current limiter circuitry further comprises:
a third controllable switch device;
a controllable second current source for generating a second reference current; and
buffer circuitry,
wherein the current limiter circuitry is configured such that an output of the buffer circuitry toggles when a current through the third controllable switch device reaches a predetermined level.

15. The circuitry according to claim 14, further comprising a mode control switch configured to selectively couple a control terminal of the controllable switch device to a control voltage so as to cause the controllable switch device to operate in a fully on mode, wherein a control terminal of the mode control switch is coupled to an output of the buffer circuitry via delay circuitry.

16. Circuitry for providing an output voltage, the circuitry comprising:
amplifier circuitry configured to generate and output a voltage to an output node, wherein the amplifier circuitry is configured for operation in either a first mode or a second mode; and
current limiter circuitry, wherein the current limiter circuitry is selectively operable to limit a current supplied at the output node,
wherein the circuitry is configured to switch the amplifier circuitry into the second mode in response to activation of the current limiter circuitry to limit the current supplied at the output node.

17. Circuitry for providing an output voltage, the circuitry comprising:
amplifier circuitry configured to generate the output voltage, the amplifier circuitry being operable in a first mode and a second mode; and
a plurality of output nodes, each of the plurality of output nodes being coupled to an output of the amplifier circuitry by a respective one of a plurality of selectively activatable current limiters,
wherein the circuitry is configured to force the amplifier circuitry to operate in the second mode in response to activation of any one of the plurality of selectively activatable current limiters.

18. Integrated circuitry comprising the circuitry of claim 1.

19. A device comprising the circuitry of claim 1, wherein the device comprises a mobile telephone, a tablet or laptop computer, a smart speaker, an accessory device, headphones, earphones or earbuds.

\* \* \* \* \*

UNITED STATES PATENT AND TRADEMARK OFFICE
CERTIFICATE OF CORRECTION

| | | |
|---|---|---|
| PATENT NO. | : 12,273,083 B2 | Page 1 of 1 |
| APPLICATION NO. | : 17/233811 | |
| DATED | : April 8, 2025 | |
| INVENTOR(S) | : Bowlerwell et al. | |

It is certified that error appears in the above-identified patent and that said Letters Patent is hereby corrected as shown below:

In the Claims

In Column 19, Line 54, in Claim 10, delete "amplifier" and insert -- amplifier circuitry --, therefor.

Signed and Sealed this
Thirteenth Day of January, 2026

John A. Squires
*Director of the United States Patent and Trademark Office*